(12) United States Patent
Bala

(10) Patent No.: US 9,910,939 B2
(45) Date of Patent: Mar. 6, 2018

(54) CHARACTERIZATION OF GRAPHICAL REPRESENTATION OF NUMERICAL SIMULATION RESULTS

(71) Applicant: Livermore Software Technology Corporation, Livermore, CA (US)

(72) Inventor: Suri Bala, Rochester Hills, MI (US)

(73) Assignee: Livermore Software Technology Corp., Livermore, CA (US)

(*) Notice: Subject to any disclaimer, the term of this patent is extended or adjusted under 35 U.S.C. 154(b) by 833 days.

(21) Appl. No.: 14/497,043

(22) Filed: Sep. 25, 2014

(65) Prior Publication Data
US 2016/0092784 A1    Mar. 31, 2016

(51) Int. Cl.
*G06F 17/50* (2006.01)
*G06F 17/30* (2006.01)
*G06K 9/00* (2006.01)
*G06N 99/00* (2010.01)

(52) U.S. Cl.
CPC .... *G06F 17/5009* (2013.01); *G06F 17/30244* (2013.01); *G06F 17/5095* (2013.01); *G06K 9/00456* (2013.01); *G06N 99/005* (2013.01)

(58) Field of Classification Search
CPC ............ G06F 17/5009; G06F 17/5095; G06N 99/005; G06K 9/00456
See application file for complete search history.

(56) References Cited

U.S. PATENT DOCUMENTS

| 2011/0091105 A1* | 4/2011 | Perronnin | G06K 9/4671 382/170 |
| 2013/0290222 A1* | 10/2013 | Gordo | G06F 17/30247 706/12 |
| 2014/0079314 A1* | 3/2014 | Yakubovich | G06K 9/6254 382/159 |

(Continued)

OTHER PUBLICATIONS

Qin et al., "A deep learning approach to the classification of 3D CAD models" (Feb. 2014), Journal of Zhejiang University Science C, vol. 15, Issue 2, pp. 91-106 [retrieved from https://link.springer.com/article/10.1631/jzus.C1300185].*

*Primary Examiner* — Brian W Wathen
(74) *Attorney, Agent, or Firm* — Roger H. Chu

(57) ABSTRACT

Methods of characterizing or classifying graphical representation of numerical simulation results are disclosed. A training database is created in a computer system by including a plurality of graphical representations of respective results obtained from a plurality of numerical simulations. Each graphical representation is associated with a textual description of a pertinent feature related to the numerical simulations by user. A quality index with respect to the associated textual description is calculated for each graphical representation by application module using an autocorrelation technique of correlating all graphical representations with one another in the training database. A new graphical representation obtained from another numerical simulation can then be characterized with one of the textual descriptions and a corresponding confidence score by comparing (Continued)

the new graphical representation with all graphical representations in the training database. The training database may be improved by adding or removing appropriate graphical representations in accordance with predefined criteria.

9 Claims, 7 Drawing Sheets

(56) References Cited

U.S. PATENT DOCUMENTS

2014/0156572 A1* 6/2014 Katz .................... G06F 11/261
  706/12
2015/0088474 A1* 3/2015 Frost ................... G06F 17/5018
  703/6

* cited by examiner

CHARACTERIZATION OF GRAPHICAL REPRESENTATION OF NUMERICAL SIMULATION RESULTS

FIELD

The present invention generally relates to computer aided engineering design, more particularly to improved methods of characterizing of classifying graphical representation of numerical simulation results.

BACKGROUND

Computer or numerical simulations have used for assisting users (e.g., engineers, scientists, etc.) to design complex product (e.g., automobile, airplane, etc.). One of more challenging numerical simulations is to assess crashworthiness of a vehicle. With advance of computer technologies, numerical simulation results are presented in graphical form so that the user can observe the results visually instead of going through numerical results to figure out. Additionally, many more numerical simulations are performed for a single design. One of the problems associated with many simulation results is to require user to manually examine every graphical results, which is tedious and error-prone. Therefore, it would be desirable to have improved methods of characterizing of classifying graphical representation of numerical simulation results.

BRIEF SUMMARY

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods of characterizing or classifying graphical representation of numerical simulation results are disclosed. According to one embodiment of the present invention, a training database is created in a computer system by including a plurality of graphical representations of respective results obtained from a plurality of numerical simulations. Each graphical representation is associated with a textual description of a pertinent feature related to the numerical simulations by a user or another user. A quality index with respect to the associated textual description is calculated for each graphical representation by one of at least one application module installed on the computer system using an autocorrelation technique of correlating the graphical representations with one another in the training database. A new graphical representation obtained from another numerical simulation can then be characterized or classified by the application module or another application module with one of the textual descriptions and a corresponding confidence score. In particular, this is achieved by graphically comparing the new graphical representation with each one of the graphical representations in the training database. Finally, the training database can be improved by adding or removing appropriate graphical representations in accordance with predefined training database update criteria.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Furthermore, the order of blocks in process flowcharts or diagrams representing one or more embodiments of the invention do not inherently indicate any particular order nor imply any limitations in the invention.

Embodiments of the present invention are discussed herein with reference to FIGS. 1-6. However, those skilled in the art will readily appreciate that the detailed description given herein with respect to these figures is for explanatory purposes as the invention extends beyond these limited embodiments.

Figure 1:
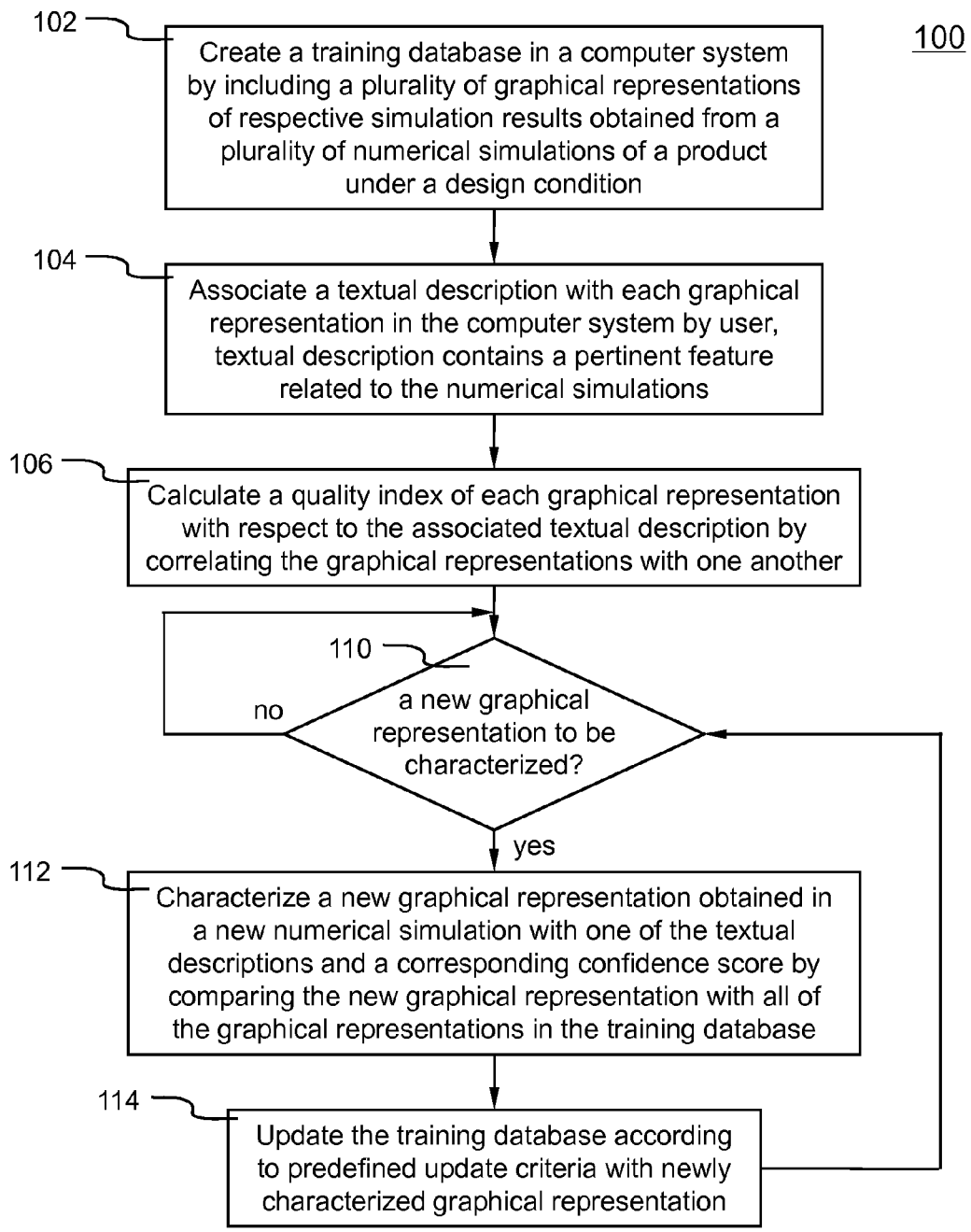
FIG. 1 is a flowchart illustrating an example process of characterizing or classifying graphical representation of numerical simulation results in accordance with one embodiment of the present invention.
Figure 2:
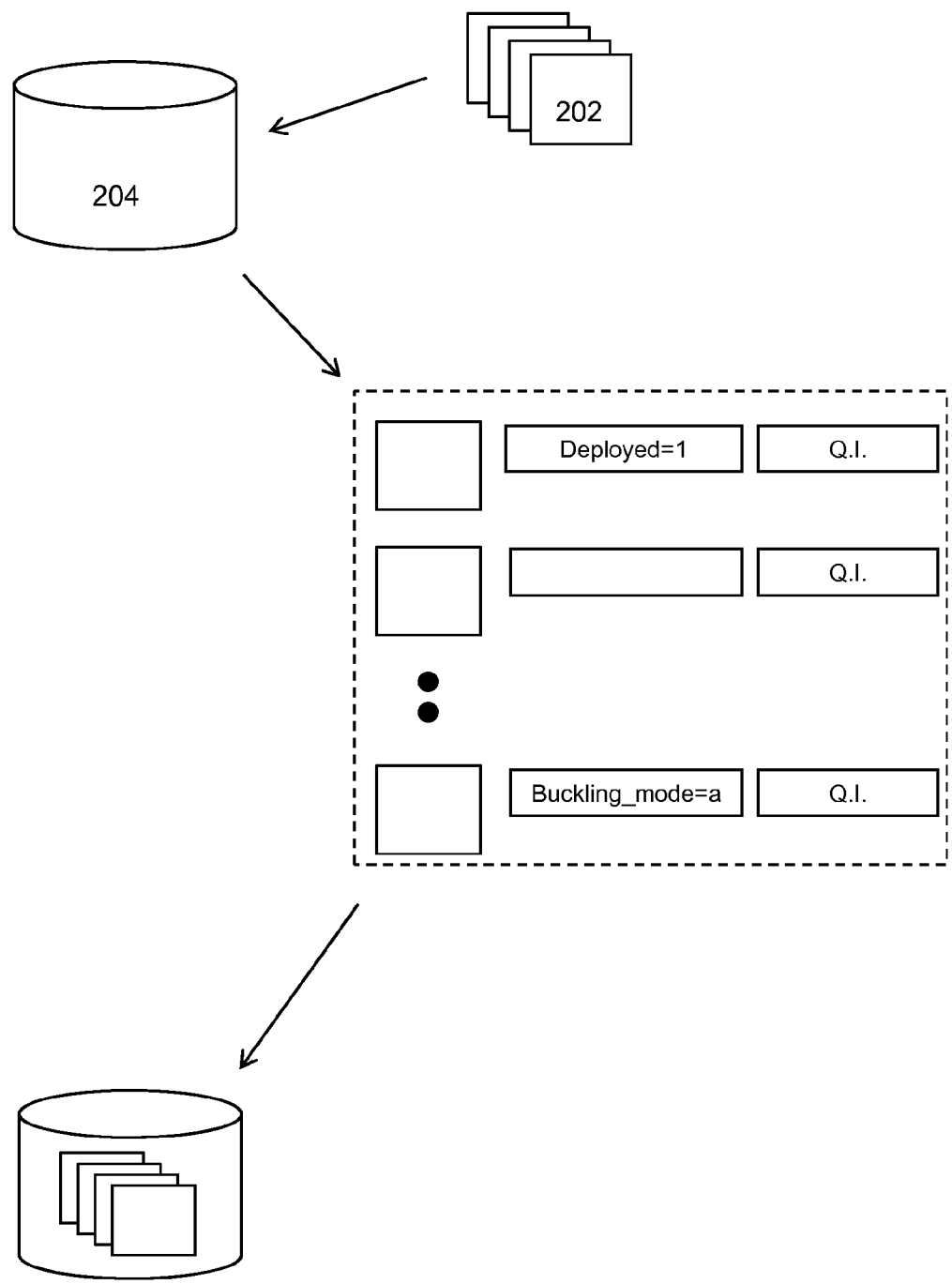
FIG. 2 is a diagram showing steps of forming an example training database in accordance with one embodiment of the present invention.

Referring first of FIG. 1, it is shown a flowchart illustrating an example process 100 of characterizing or classifying graphical representation of numerical simulation results. Process 100 is preferably implemented in software and preferably understood with other figures.

Figure 4A:
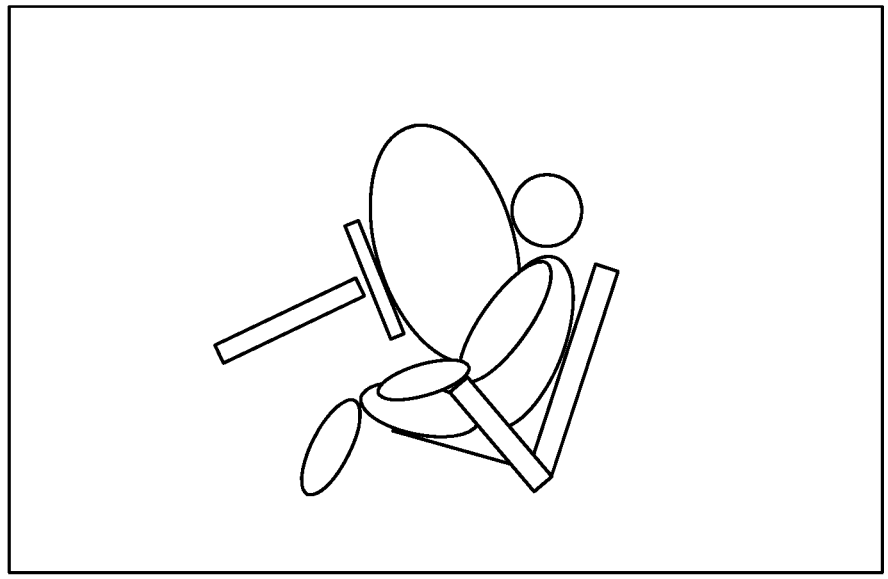
FIGS. 4A-4D are diagrams showing example graphical representations, according to an embodiment of the present invention.
Figure 4B:
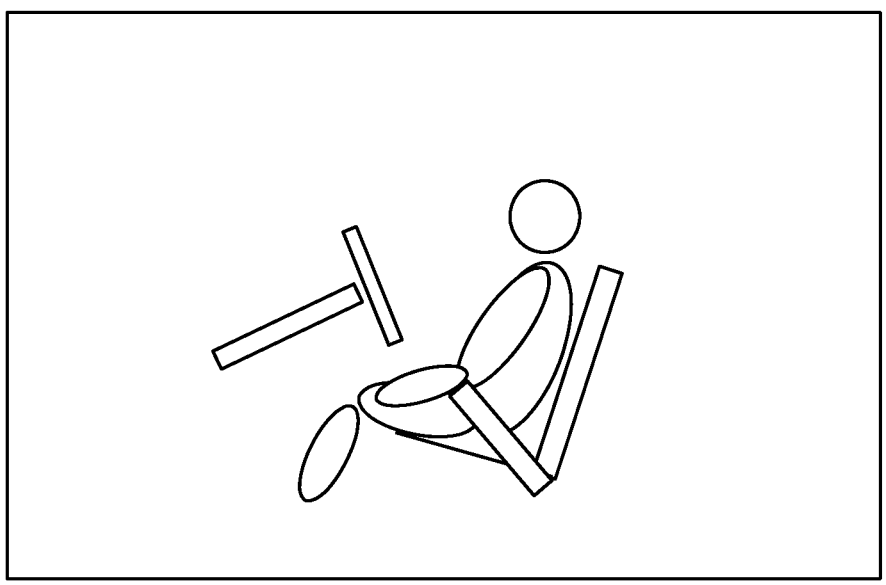
Figure 4C:
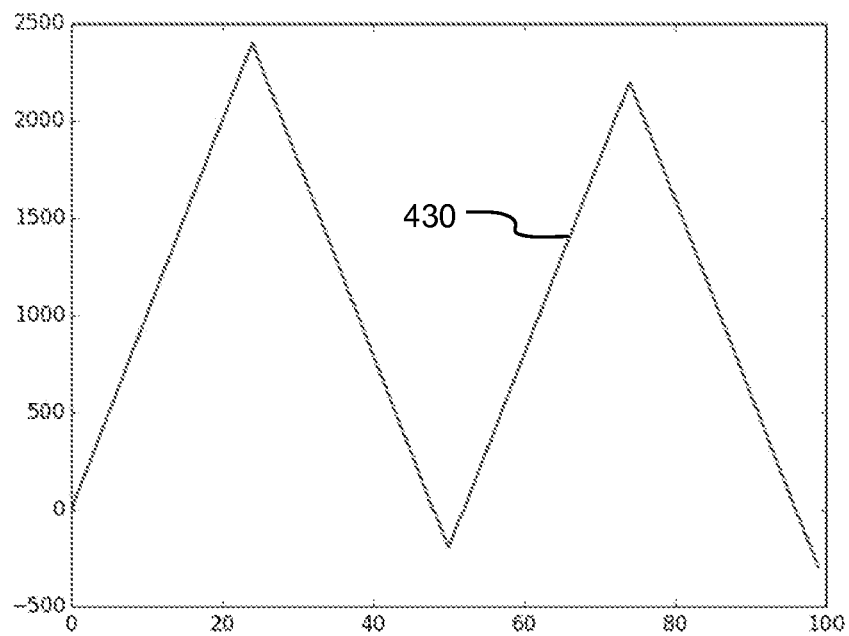
Figure 4D:
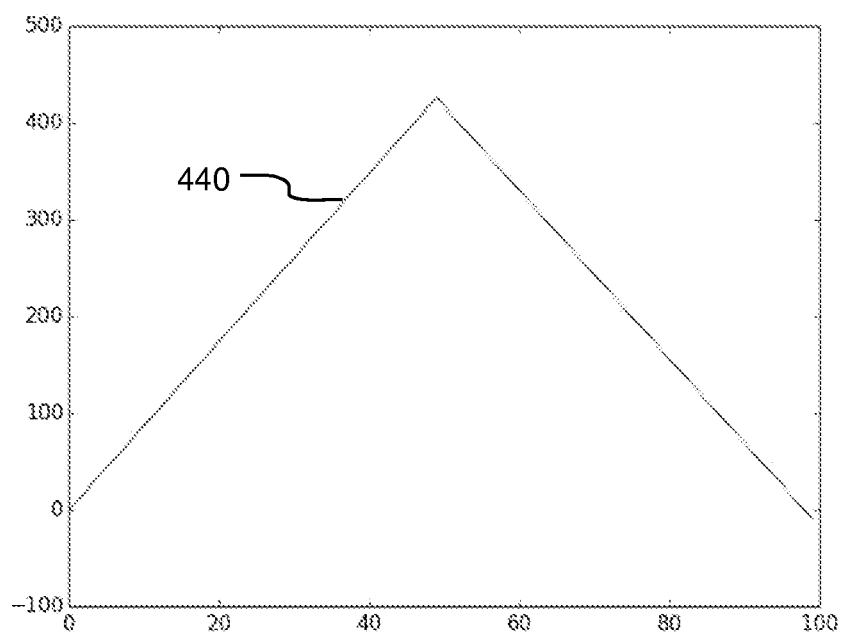
Figure 5:
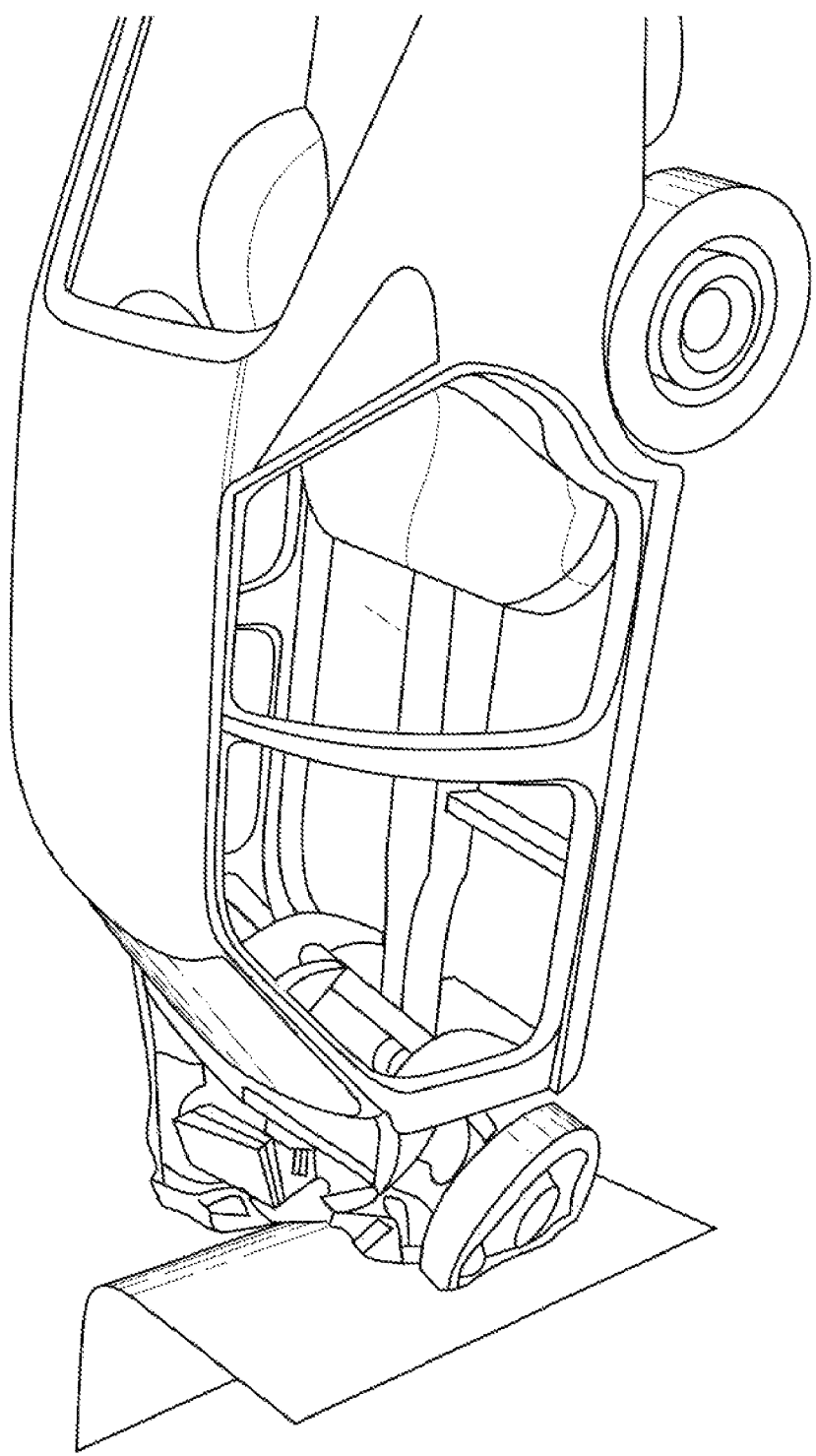
FIG. 5 is a diagram showing an example numerical simulation, according to an embodiment of the present invention.

Process 100 starts at action 102. A training database (database 204 in FIG. 2) is created initially by including a plurality of graphical representations 202 of respective simulation results obtained from numerical simulations of a product (e.g., a car, an airplane, etc.) under a design condition (e.g., simulating an automobile crashed into a barrier shown in FIG. 5). The training database may be stored in a local or remote storage subsystem operatively coupling to a computer system (e.g., a computer system 600 in FIG. 6). Examples of graphical representations are shown in FIGS. 4A and 4B.

At action 104, each of the graphical representations 202 in the training database 204 is associated with a textual description by users (e.g., scientist, engineer, etc.). Textual description contains a pertinent feature related to the numerical simulation. For example, in a numerical simulation of a vehicle's crashworthiness, one of the pertinent features is that "what mode is the airbag deployed?". In the example graphical representation in FIG. 4A, the airbag is fully deployed. The airbag is not deployed in FIG. 4B. The airbag could also be partially deployed (not shown). In another example, a pertinent feature may be "which buckling mode does the bumper show?". The texture description may be coded with phrases such as "deployed=1" for deployed airbag, or "buckling mode=a" for the bumper buckled right or left.

Furthermore, in another embodiment of the present invention, the pertinent feature can be deceleration time history of the vehicle in a computer simulation of vehicle's crashworthiness. The time history is generally plotted in a normalized X-Y curve shown in FIGS. 4C and 4D. The shape of the normalized X-Y curve can be characterized or classified, for example, double peaks in curve 430 while a single peak is shown in curve 440. Time history of other features may be plotted also, for example, displacement, force or pressure.

A quality index is then calculated for each of the graphical representation with respect to the textual feature by one of the application modules installed on the computer system using an autocorrelation technique of correlating all of the graphical representations in the training database with one another at action 106. The quality index is a numerical indicator showing the quality of the associated textual description. In other words, the higher the quality index is, the better the graphical representation represents the pertinent feature described by the textual description.

Figure 3:
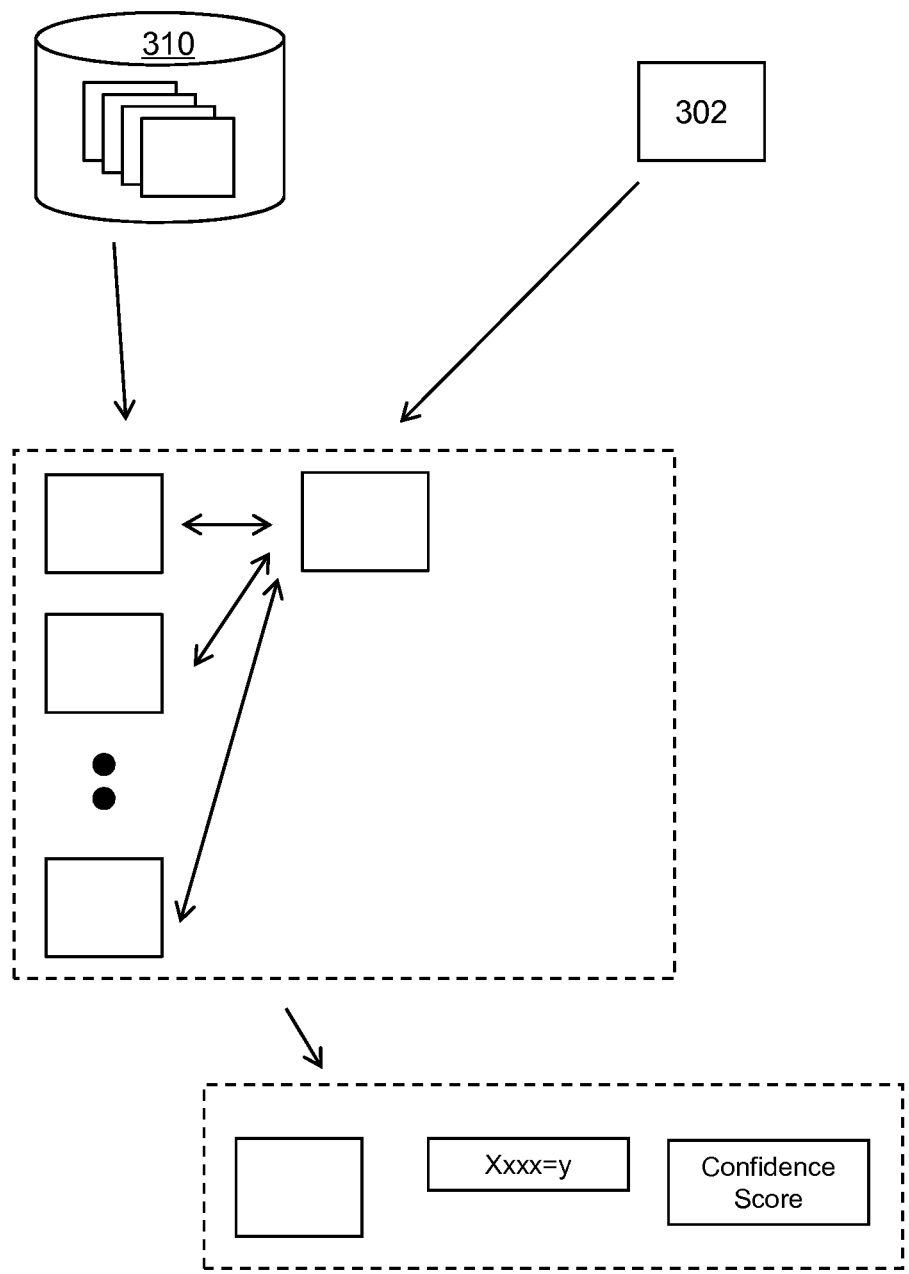
FIG. 3 is a diagram showing steps of classifying a graphical representation using the training database, according to an embodiment of the present invention.

After the training database has been established, process 100 moves to decision 110 waiting for a new graphical representation obtained from a new numerical simulation. As soon as a new graphical representation is available to be characterized of classified, process 100 follows the "yes" branch to action 112. Otherwise process 100 idles by following the "no" branch back to decision 110. At action 112, the new graphical representation is characterized or classified by the application module or another application module with one of textual descriptions and a corresponding confidence score. In particular, the new graphical representation 302 is graphically compared with all of the graphical representations in the training database 310 as shown in FIG. 3. The confidence score indicates the level of confidence of computer associated textual description. Graphical representation comparison can be performed with a number of well-known schemes. For example, in one embodiment, the graphical representation is converted to fingerprints before a comparison is performed.

The quality index can be calculated as follows: from a set of manually labeled graphical representations, divide the set into 70% as "Train" and 30% as "Test". Build a model using the "Train" to predict the "Test". The accuracy is then computed based on how many correct predictions are made for the "Test". If all of the "Test" are predicted correctly, then the quality index is 100%. If half of the "Test" are correctly predicted, then the quality index is 50%.

Finally, at action 114, the training database can be updated using the newly characterized graphical representation according to predefined training database update criteria. For example, when confidence score of the newly characterized graphical representation is above a certain level, the new graphical representation is added to the training database. Further, the graphical representation with lower quality index comparing to others in the training database may be removed periodically. Process 100 goes back to decision 110 waiting for another new graphical representation to be characterized or classified.

Figure 6:
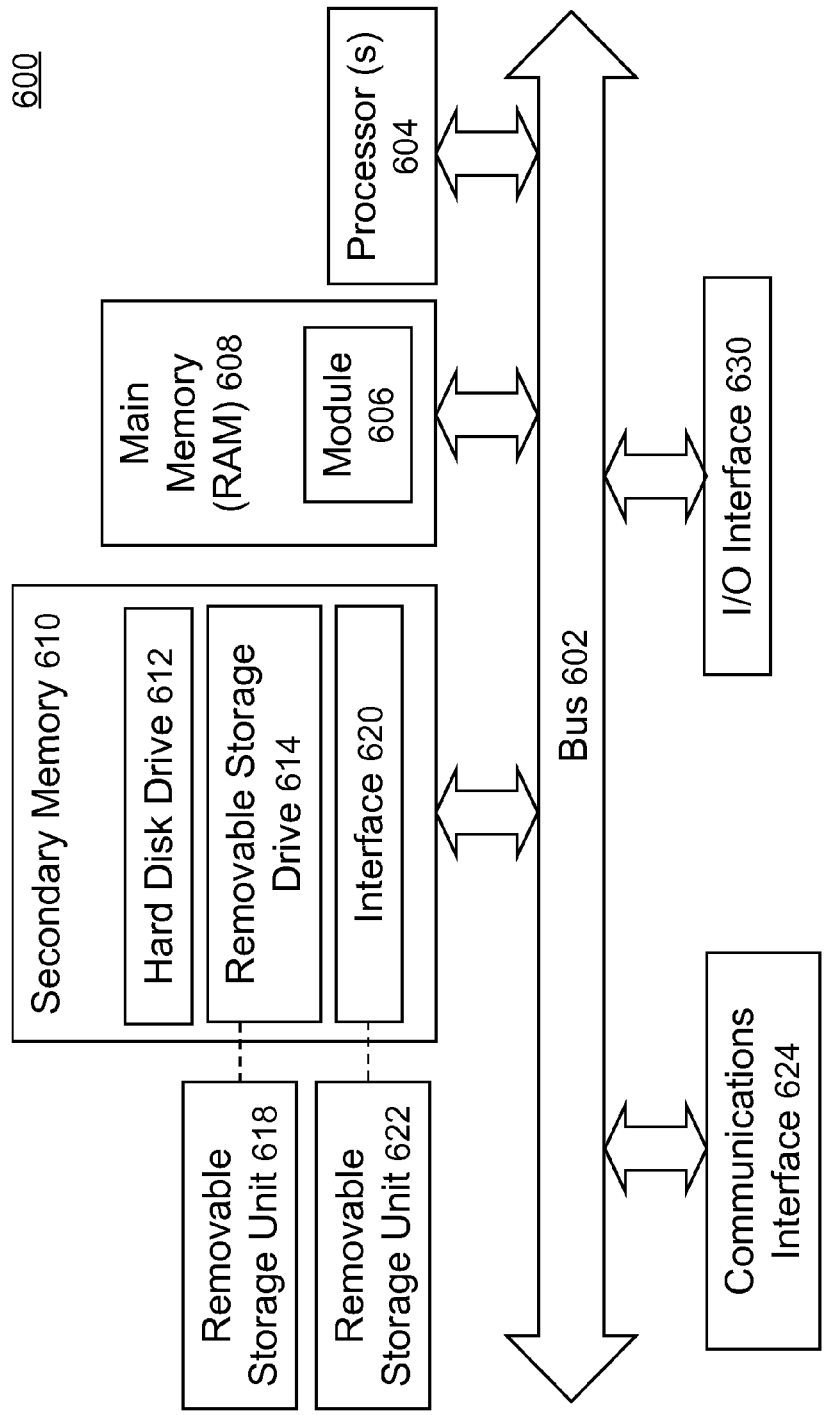
FIG. 6 is a function diagram showing salient components of a computing device, in which an embodiment of the present invention may be implemented.

According to one aspect, the present invention is directed towards one or more computer systems capable of carrying out the functionality described herein. An example of a computer system 600 is shown in FIG. 6. The computer system 600 includes one or more processors, such as processor 604. The processor 604 is connected to a computer system internal communication bus 602. Various software embodiments are described in terms of this exemplary computer system. After reading this description, it will become apparent to a person skilled in the relevant art(s) how to implement the invention using other computer systems and/or computer architectures.

Computer system 600 also includes a main memory 608, preferably random access memory (RAM), and may also include a secondary memory 610. The secondary memory 610 may include, for example, one or more hard disk drives 612 and/or one or more removable storage drives 614, representing a floppy disk drive, a magnetic tape drive, an optical disk drive, etc. The removable storage drive 614 reads from and/or writes to a removable storage unit 618 in a well-known manner. Removable storage unit 618, represents a floppy disk, magnetic tape, optical disk, etc. which is read by and written to by removable storage drive 614. As will be appreciated, the removable storage unit 618 includes a computer usable storage medium having stored therein computer software and/or data.

In alternative embodiments, secondary memory 610 may include other similar means for allowing computer programs or other instructions to be loaded into computer system 600. Such means may include, for example, a removable storage unit 622 and an interface 620. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 622 and interfaces 620 which allow software and data to be transferred from the removable storage unit 622 to computer system 600. In general, Computer system 600 is controlled and coordinated by operating system (OS) software, which performs tasks such as process scheduling, memory management, networking and I/O services.

There may also be a communications interface 624 connecting to the bus 602. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc. The computer 600 communicates with other computing devices over a data network based on a special set of rules (i.e., a protocol). One of the common protocols is TCP/IP (Transmission Control Protocol/Internet Protocol) commonly used in the Internet. In general, the communication interface 624 manages the assembling of a data file into smaller packets that are transmitted over the data network or reassembles received packets into the original data file. In addition, the communication interface 624 handles the address part of each packet so that it gets to the right destination or intercepts packets destined for the computer 600. In this document, the terms "computer program medium" and "computer usable medium" are used to generally refer to media such as removable storage drive 614, and/or a hard disk installed in hard disk drive 612. These computer program products are means for providing software to computer system 600. The invention is directed to such computer program products.

The computer system 600 may also include an input/output (I/O) interface 630, which provides the computer system 600 to access monitor, keyboard, mouse, printer, scanner, plotter, and alike.

Computer programs (also called computer control logic) are stored as application modules 606 in main memory 608 and/or secondary memory 610. Computer programs may also be received via communications interface 624. Such computer programs, when executed, enable the computer system 600 to perform the features of the present invention as discussed herein. In particular, the computer programs, when executed, enable the processor 604 to perform features of the present invention. Accordingly, such computer programs represent controllers of the computer system 600.

In an embodiment where the invention is implemented using software, the software may be stored in a computer program product and loaded into computer system 600 using removable storage drive 614, hard drive 612, or communications interface 624. The application module 606, when executed by the processor 604, causes the processor 604 to perform the functions of the invention as described herein.

The main memory 608 may be loaded with at least one application module 606 that can be executed by one or more processors 604 with or without a user input through the I/O interface 630 to achieve desired tasks. In operation, when at least one processor 604 executes one of the application modules 606, the results are computed and stored in the secondary memory 610 (i.e., hard disk drive 612). Graphical representation of numerical simulation results can be displayed to the I/O interface 630 (e.g., a graphic display devise).

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. In summary, the scope of the invention should not be restricted to the specific exemplary embodiments disclosed herein, and all modifications that are readily suggested to those of ordinary skill in the art should be included within the spirit and purview of this application and scope of the appended claims.

I claim:

1. A method of characterizing graphical representation of numerical simulation results comprising:
    initially creating, by a user, a training database in a computer system by including a plurality of graphical representations of respective simulation results obtained from a plurality of numerical simulations of a product under a design condition;
    associating, by said user or another user, a textual description with each graphical representation in the computer system, the textual description comprising a pertinent feature related to the numerical simulations;
    calculating a quality index for said each graphical representation with respect to the associated textual description by one of at least one application module installed in the computer system using an autocorrelation technique of correlating the graphical representations with one another;
    characterizing, by said one or another of the at least one application module, a new graphical representation obtained in each new numerical simulation with one of the textual descriptions and a corresponding confidence score by comparing the new graphical representation to all of the graphical representations in the training database, the confidence score indicating a level of confidence with regards to said one of the textual descriptions; and
    updating the training database as a result of the new graphical representation according to predefined training database update criteria.

2. The method of claim 1, wherein said numerical simulation comprises a computer simulation of crashworthiness of a vehicle.

3. The method of claim 2, wherein the pertinent feature is related to deployment of an airbag during the computer simulation.

4. The method of claim 2, wherein the pertinent feature is related to time history of the vehicle in the computer simulation.

5. The method of claim 1, wherein the predefined training database update criteria comprises adding the new graphical representation to the training database when said confidence score of said new graphical representation is higher a predefined level.

6. The method of claim 5, wherein the predefined training database update criteria further comprises removing one of the graphical representations from the training database when the corresponding quality index is below a predefined level.

7. The method of claim 1, wherein said updating the training database is performed by said one or said another of the at least one application module.

8. The method of claim 1, wherein said updating the training database is performed manually by said user or said another user.

9. The method of claim 1, wherein said comparing the new graphical representation to all of the graphical representations in the training database comprises converting the new graphical representation and said all of the graphical representations to fingerprints before conducting the comparison.

\* \* \* \* \*